(12) United States Patent
Takahashi

(10) Patent No.: US 8,030,142 B2
(45) Date of Patent: Oct. 4, 2011

(54) SEMICONDUCTOR DEVICE AND METHOD OF DESIGNING THE SEMICONDUCTOR DEVICE

(75) Inventor: Toshifumi Takahashi, Kanagawa (JP)

(73) Assignee: Renesas Electronics Corporation, Kawasaki-shi, Kanagawa (JP)

( * ) Notice: Subject to any disclaimer, the term of this patent is extended or adjusted under 35 U.S.C. 154(b) by 709 days.

(21) Appl. No.: 11/798,735

(22) Filed: May 16, 2007

(65) Prior Publication Data
US 2007/0267761 A1 Nov. 22, 2007

(30) Foreign Application Priority Data
May 17, 2006 (JP) .................................. 2006-138212

(51) Int. Cl.
*H01L 21/82* (2006.01)
*H01L 21/00* (2006.01)
*H01L 21/84* (2006.01)

(52) U.S. Cl. ........................................ 438/152; 438/128

(58) Field of Classification Search .......... 257/202–211, 257/393, 903, 904, E27.098; 438/128–132, 438/151–155
See application file for complete search history.

(56) References Cited

U.S. PATENT DOCUMENTS
6,791,128 B1 * 9/2004 Yamauchi ...................... 257/206
7,271,451 B2 * 9/2007 Liaw ............................. 257/369

FOREIGN PATENT DOCUMENTS
JP 2005-189683 7/2005

* cited by examiner

*Primary Examiner* — Cuong Q Nguyen
(74) *Attorney, Agent, or Firm* — McGinn IP Law Group, PLLC

(57) ABSTRACT

A semiconductor device according to an embodiment of the present invention includes: a first region having patterns formed based on grid points as intersections of grid lines; and a second region including a plurality of layout cells an outer edge of which is defined by the grid points, the layout cells having patterns formed based on a wiring rule with patterns connected to patterns of the first region among the patterns being formed based on the grid points at a boundary with the first region.

19 Claims, 6 Drawing Sheets

SEMICONDUCTOR DEVICE AND METHOD OF DESIGNING THE SEMICONDUCTOR DEVICE

BACKGROUND OF THE INVENTION

1. Field of the Invention

The present invention relates to a semiconductor device and a method of designing the semiconductor device. In particular, the invention relates to a semiconductor device including a region designed to lie on grid and a region designed to be off grid, and to a method of designing the semiconductor device.

2. Description of Related Art

In recent years, a semiconductor device manufacturing process has proceeded toward fine patterning. Further, semiconductor devices can be manufactured by transferring patterns formed on a mask to a semiconductor substrate based on lithography or other such exposure technologies. This manufacturing process has a problem in that if mask patterns are formed finely as compared with the wavelength of light for exposure, transferred patterns for manufacturing a semiconductor device are displaced from the original mask patterns due to light interference or diffraction.

In recent mask pattern formation techniques, OPC (Optical Proximity Correction) has been carried out in consideration of the light interference or diffraction. According to the OPC, a pattern shape is corrected in consideration of a distance between patterns or a combination of patterns of different shapes. For example, if a distance between adjacent patterns is small, a width of a pattern formed on a semiconductor substrate becomes small, so a mask pattern is set wider than that of design data. In other words, the OPC is intended to individually correct various combinations of patterns of different pattern shapes and pitches. If mask pattern shape and pitch can be arbitrarily set, a number of combinations of various correction types are conceivable. As a result, it takes much time to execute the OPC.

To avoid such circumstances, mask patterns used for a micromachining process are formed in accordance with on-grid layout for forming patterns based on grid points as intersections of grid lines arranged at regular intervals. The numbers of pattern pitches and widths can be reduced by forming mask patterns based on the grid point. In other words, the number of combinations for the OPC is reduced to thereby save a period necessary for the OPC. The related art regarding the on-grid layout is disclosed in Japanese Unexamined Patent Application Publication No. 2005-189683.

FIG. 6 shows a mask pattern example of the related art. In a mask pattern 100 of FIG. 6, via holes 101 are formed on grid. As shown in FIG. 6, the via holes 101 are formed in regions on and around the grid points. Here, an interval between the grid points is set to, for example, the minimum pattern pitch of the manufacturing process.

However, in the on-grid layout of the related art, the grid interval is limited to the minimum pattern pitch. In other words, patterns that could be originally formed at small intervals, should be formed based on grid points. This causes a problem that the total pattern size increases and a chip area in turn increases despite the fine patterning process.

SUMMARY

A semiconductor device according to an aspect of the present invention includes: a first region having patterns formed based on grid points as intersections of grid lines; and a second region including a plurality of layout cells an outer edge of which is defined by the grid points, the layout cells having patterns formed based on a wiring rule with patterns connected to patterns of the first region among the patterns being formed based on the grid points at a boundary with the first region.

According to another aspect of the present invention, a method of designing a semiconductor device including: an element having a pattern formed based on grid points arranged at a predetermined interval; a first region having a pattern formed based on the grid points; and a second region including a plurality of layout cells an outer edge of which is defined by the grid points, includes: forming patterns of the layout cells based on a wiring rule; and forming patterns to be connected to patterns of the first region among the patterns of the layout cells, based on the grid points at a boundary with the first region.

According to the semiconductor device and the method of designing the semiconductor device of the present invention, a first region (for example, on-grid region) having patterns formed based on grid points is provided. This reduces the number of pattern pitches or widths to thereby facilitate OPC. Further provided is a second region (for example, off-grid region) the outer edge of which is defined by the grid points with inner patterns formed based on the wiring rule, in addition to the on-grid region. Hence, patterns in the layout cell can be formed with a smaller pitch than a pitch of patterns formed based on grid points, in a region the pattern pitch of which is defined to be smaller than the grid point interval by the wiring rule. In other words, a layout area of a functional circuit patterned in the layout cell is smaller than that of the on-grid region. Therefore, according to the semiconductor device and the method of designing the semiconductor device of the present invention, it is possible to save both of an effort for OPC and a chip area.

Further, among the patterns in the layout cell, patterns connected to patterns of the on-grid region are formed based on grid points at the boundary with the on-grid region. This enables smooth connection between patterns of the on-grid region and patterns of the off-grid region.

According to the semiconductor device and the method of designing the semiconductor device of the present invention, it is possible to save both of an effort for OPC and a chip area.

BRIEF DESCRIPTION OF THE DRAWINGS

The above and other objects, advantages and features of the present invention will be more apparent from the following description of certain preferred embodiments taken in conjunction with the accompanying drawings, in which.

DETAILED DESCRIPTION OF THE PREFERRED EMBODIMENTS

The invention will be now described herein with reference to illustrative embodiments. Those skilled in the art will recognize that many alternative embodiments can be accomplished using the teachings of the present invention and that the invention is not limited to the embodiments illustrated for explanatory purposes.

First Embodiment

Figure 1:
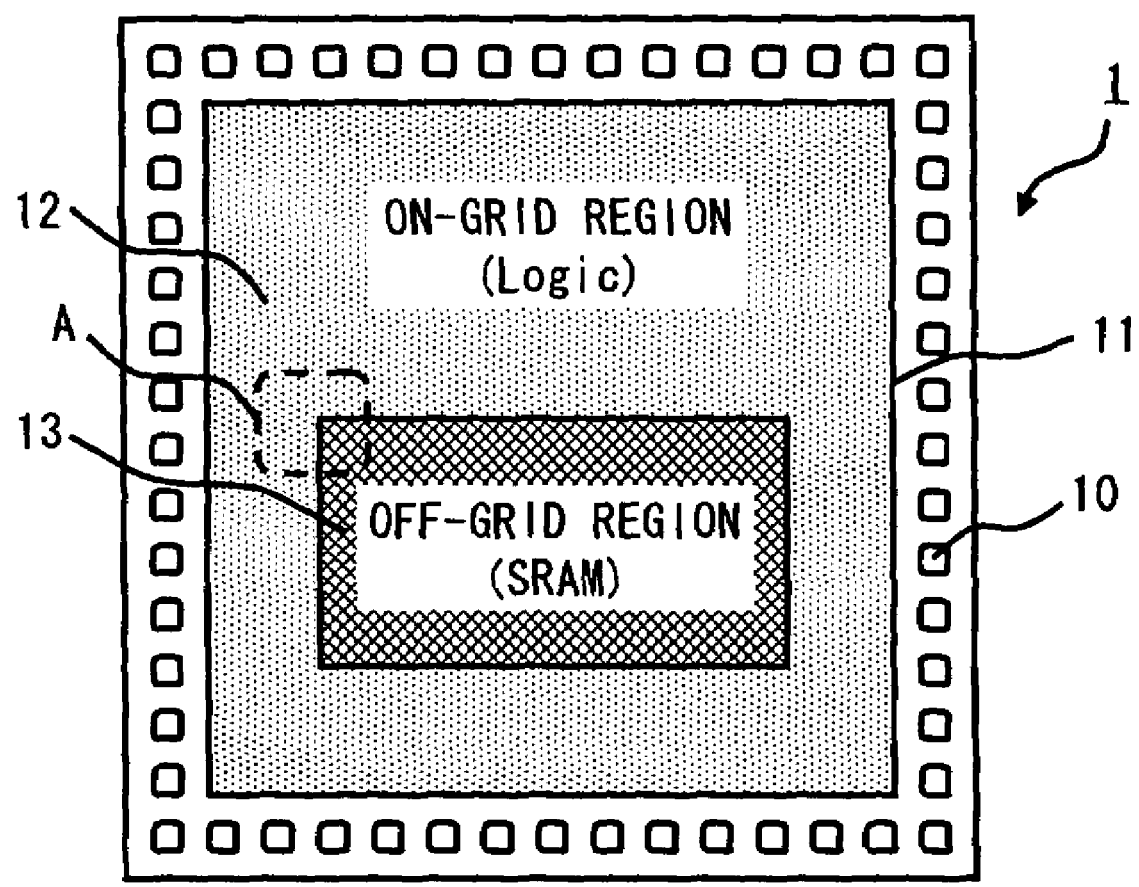
FIG. 1 is a schematic diagram of a semiconductor device according to a first embodiment of the present invention.

A first embodiment of the present invention is described hereinbelow with reference to the accompanying drawings. FIG. 1 is a schematic diagram of a semiconductor device 1 of the first embodiment. As shown in FIG. 1, the semiconductor device 1 includes a pad 10 and a circuit formation region 11. The pad 10 is an input/output terminal of the semiconductor device 1. In the circuit formation region 11, a circuit for executing functions of the semiconductor device 1 and circuit blocks are formed. In addition, the circuit formation region 11 includes a first region (for example, an on-grid region 12) and a second region (for example, an off-grid region 13).

Figure 2:
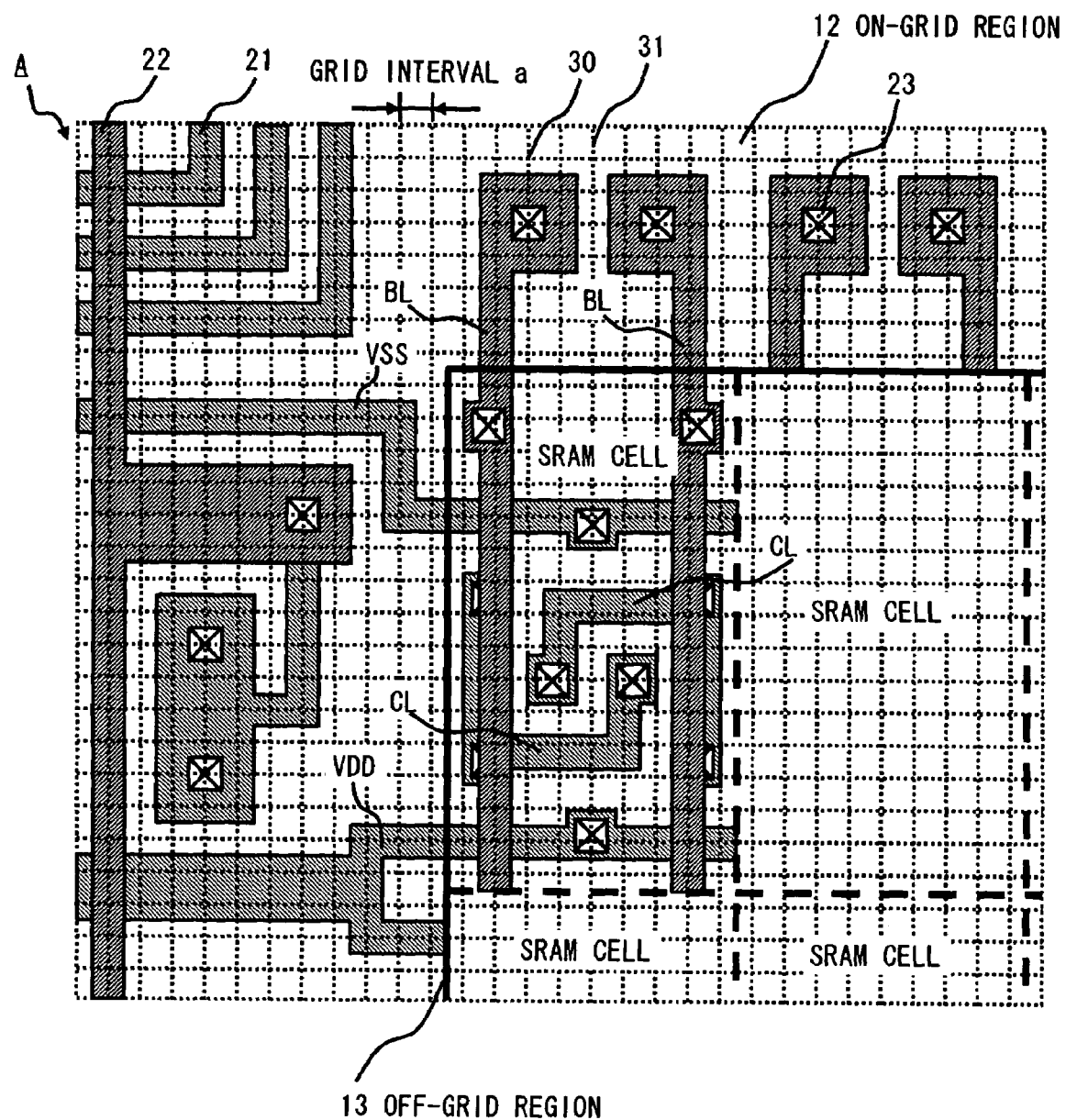
FIG. 2 is an enlarged view of a region A of FIG. 1.

In the on-grid region 12, patterns are formed based on grid points. A logic circuit is, for example, formed in this region. In the off-grid region 13, plural layout cells the outer edge of which is defined by the grid points are formed. In this region, for example, SRAM (Static Random Access Memory) etc. are formed. Incidentally, the layout cells are described in more detail later. The on-grid region 12 and the off-grid region 13 are detailed next. FIG. 2 is an enlarged view of a region A at the boundary between the on-grid region 12 and the off-grid region 13.

As shown in FIG. 2, the region A includes grid points 30. In FIG. 2, grid lines 31 extend to connect between the grid points. The grid points 30 are intersections of the grid lines 31. A distance between the grid points (grid interval a) is set based on design rule of the minimum pattern width. The grid interval a can be freely set as appropriate and may be an integral multiple or ½ of the minimum pattern width specified by the rule.

The region A includes the on-grid region 12 and the off-grid region 13. Further, the region A includes a first metal wiring layer 21, a second metal wiring layer 22, and a connection line (via hole) 23. In the on-grid region 12, the first metal wiring layer 21, the second metal wiring layer 22, and the via hole 23 are laid out based on the grid points 30. The first metal wiring layer 21, the second metal wiring layer 22, and the via hole 23 of the on-grid region 12 are arranged such that the pattern center is the grid point 30 and the pattern outer edge passes through the midpoint between the grid points 30.

In the off-grid region 13, plural layout cells of substantially the same layout pattern are formed. Patterns in the layout cell are formed based on the wiring rule. Among the patterns in the layout cell, patterns to be connected to patterns of the on-grid region 12 are formed based on the grid points at the boundary with the on-grid region 12. In the illustrated example of FIG. 2, an SRAM cell is formed as a functional circuit in the layout cell. Patterns of the SRAM cell are laid out based on the wiring rule specified in a manufacturing process. The wiring rule is described in detail later.

The SRAM cell of FIG. 2 includes, as metal lines, a bit line BL, a ground line VSS, a power supply line VDD, a cell line CL, and a via hole 23. The bit line BL is an SRAM input/output line, which is formed as, for example, the second metal wiring layer. The ground line VSS applies a ground potential to the SRAM, and is formed as, for example, the first metal wiring layer. The power supply line VDD applies a power supply potential to the SRAM, and is formed as, for example, the first metal wiring layer. The cell line CL connects between elements in the SRAM, and is formed as, for example, the first metal wiring layer. Detailed description about SRAM cells in the off-grid region 13 is given below.

Here, the bit line BL, the power supply line VDD, and the ground line VSS of the SRAM cell are connected to lines in the on-grid region 12. Patterns of the layout cell in the off-grid region 13 are not arranged based on the grid points although following the wiring rule. To that end, patterns of the layout cell in the off-grid region 13 are arranged based on the grid points at the boundary between the on-grid region 12 and the off-grid region 13. In other words, the bit line BL, the power supply line VDD, and the ground line VSS of the SRAM cell are laid out based on the grid points at the outer edge of the SRAM cell.

Figure 3:
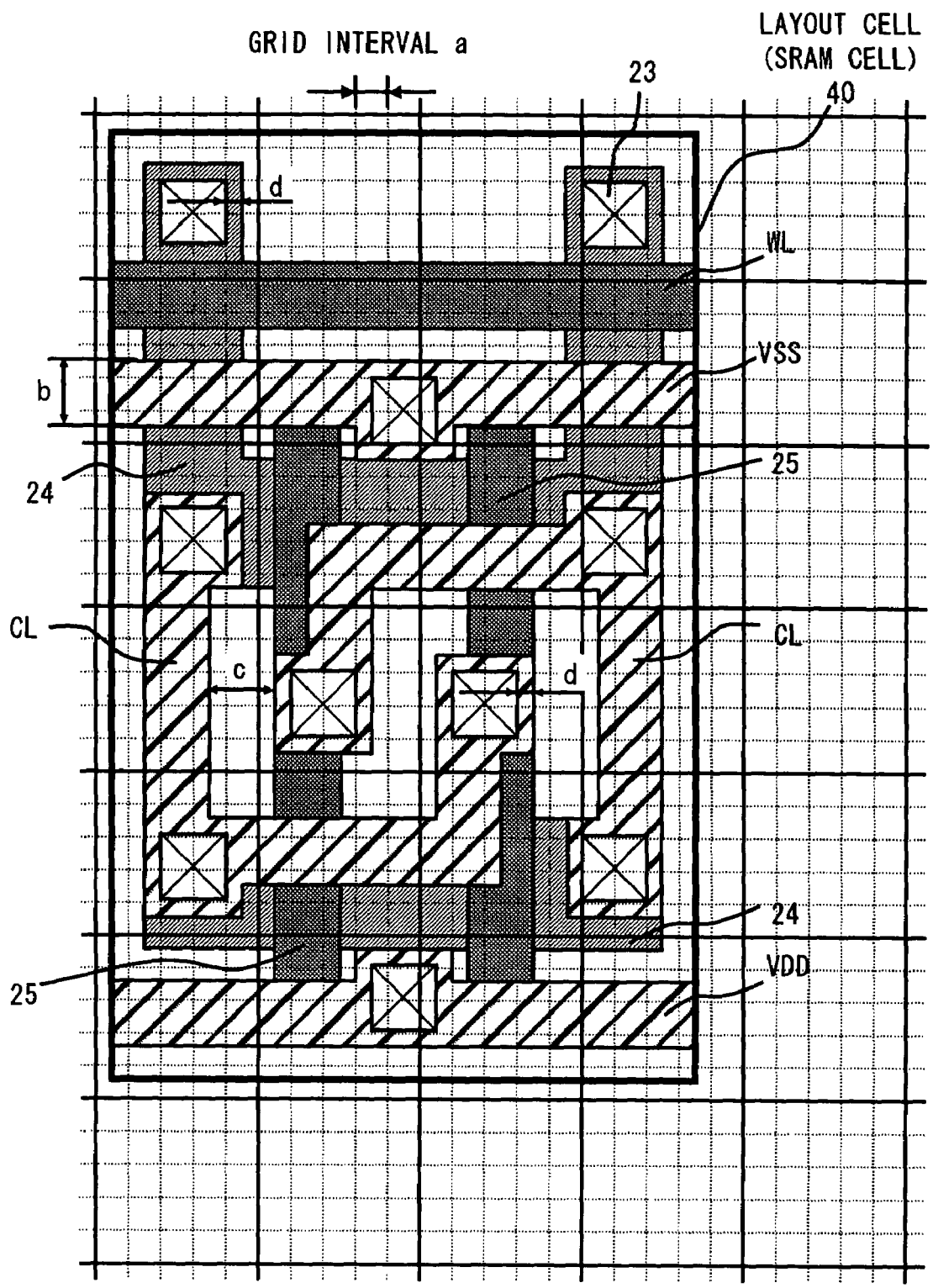
FIG. 3 shows a layout cell example formed in an off-grid region according to the first embodiment.

Description is made of an SRAM cell as an example of the layout cell formed in the off-grid region 13. FIG. 3 is a schematic diagram of a layout cell 40 (for example, SRAM cell). Incidentally, the bit line BL is omitted from FIG. 3 for ease of illustration. In FIG. 3, the grid interval a is set to ½ of the design rule of the minimum pattern width.

As shown in FIG. 3, the SRAM cell is completed such that a diffusion layer 24 is formed on the lowermost substrate layer, a word line WL and a gate electrode 25 are formed in a gate layer underlying the substrate region, and the power supply line VDD, the ground line VSS, and the cell line CL are formed in a metal wiring layer underlying the gate layer. In the SRAM cell in the off-grid region 13, the regions and lines are formed based on the wiring rule. The wiring rule defines, for example, the minimum pattern width b, the minimum pattern pitch c, and an inclusive distance d. The minimum pattern width b defines the minimum pattern width in a direction orthogonal to the pattern longitudinal direction. The minimum pattern pitch c defines the minimum interval between patterns formed in the same layer. As the inclusive distance d, in general, a value smaller than the minimum pattern width b or the minimum pattern pitch c is set. The inclusive distance d defines a distance between the outer edge of the via hole and that of the metal line in a region where a via-hole region overlap a line region.

The SRAM cell lines or regions of FIG. 3 are patterned into a size not smaller than the minimum pattern width b. Further, under patterning conditions, a distance between patterns formed in the same layer is set to the minimum pattern pitch c or more. In the patterning conditions of this embodiment, one side of the via hole 23 corresponds to the minimum pattern width b. The via hole 23 is formed in the same region as the metal lines, the diffusion layer, and the gate electrode as viewed from above in order to connect patterns of the metal wiring layer and the other patterns. In this case, if the via hole 23 and the metal line patterned with the minimum pattern width b are formed in the same region, metal lines or other patterns formed in the same region as the via hole 23 are patterned with a large width to secure the inclusive distance d.

Figure 4:
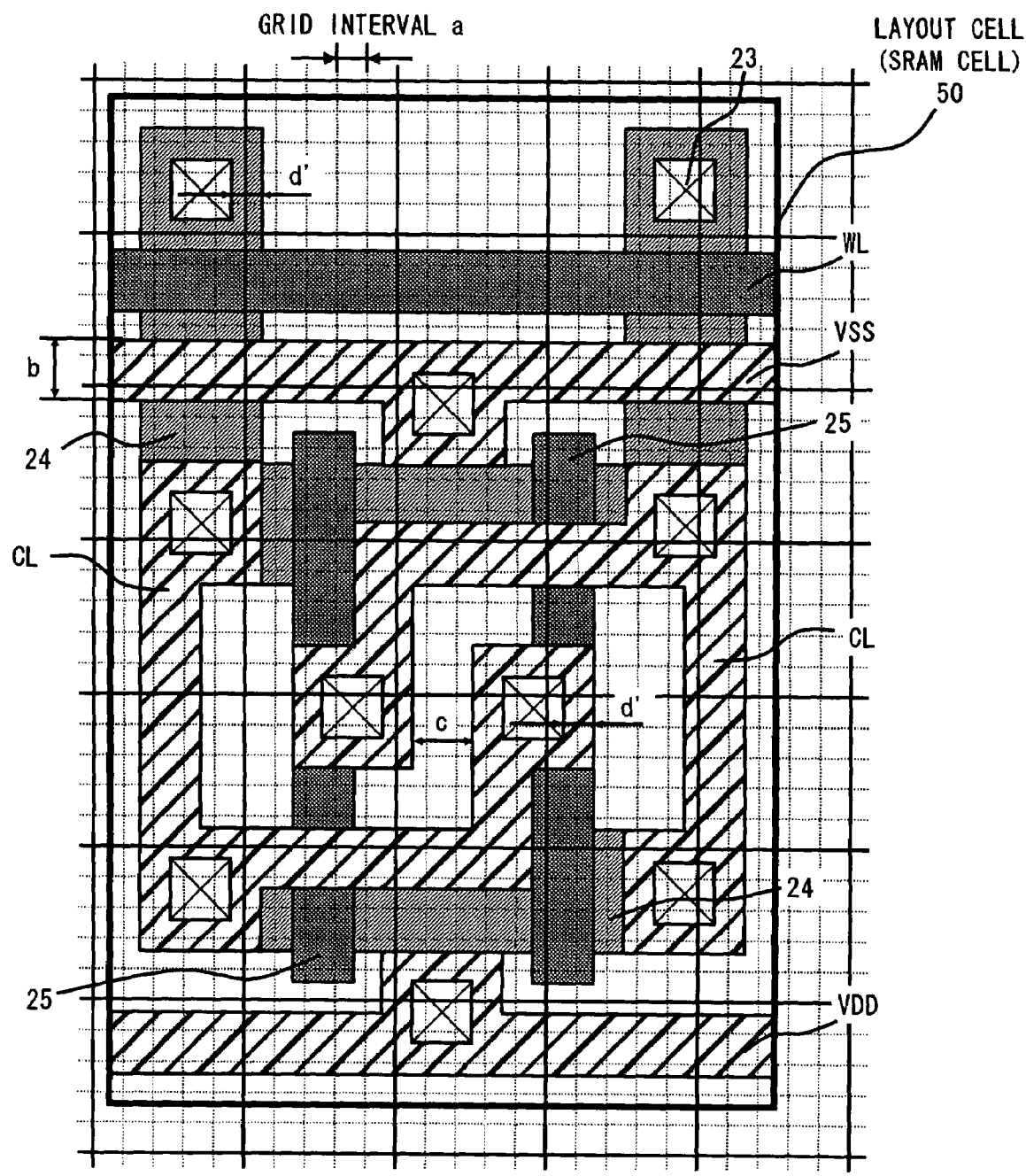
FIG. 4 shows a layout cell example formed in an off-grid region according to the first embodiment.

FIG. 4 shows a layout example where the layout cell of the off-grid region 13 is formed in the on-grid region 12. Incidentally, in the illustrated example of FIG. 4 as well, the grid interval a is ½ of the minimum pattern width specified by the design rule similar to the example of FIG. 3. The SRAM cell of FIG. 4 also satisfies the wiring rule. However, in the on-grid region 12, patterns should be laid out based on grid points, so an inclusive distance d' of the SRAM of FIG. 4 is larger than the inclusive distance d of the SRAM cell of FIG. 3. As a result, the patterned SRAM cell in the on-grid region 12 is larger tan that of the off-grid region 13. A result of comparing the SRAM cell of FIG. 3 with the SRAM cell of FIG. 4 reveals that the SRAM cell of FIG. 3 requires 30

(lengthwise)×19 (widthwise) grid points, while the SRAM cell of FIG. 4 requires 34 (lengthwise)×23 (widthwise) grid points.

In fact, a semiconductor device in this embodiment includes a semiconductor substrate which is defined by a plurality of grid points arranged in a matrix, a first pattern formed on a on-grid region 12 and a second pattern formed on off-grid region 13. The first pattern running on a first direction on a semiconductor substrate, the first pattern being arranged on a first group selected from the plurality of the grid points arranged in the matrix, having a width on a second direction perpendicular to the first direction, edges of the first pattern on the second direction being arranged on a center of adjacent grid point on the second direction. The second pattern running on a first direction on a semiconductor substrate, the second pattern being arranged on a second group selected from the plurality of the grid points arranged in the matrix, having a width on a second direction perpendicular to the first direction, edges of the second pattern on the second direction not being arranged on a center of adjacent grid point on the second direction.

Moreover, In fact, a semiconductor device in this embodiment includes a plurality of first patterns and a plurality of second patterns. The first patterns having widths, each of widths corresponding to N times of minimum width, N being integer (N>1), the first patterns being arranged to have spaces between first patterns which corresponds to M times of minimum spaces, M being integer (M>1). The second patterns, the second patterns having portions which have widths, each of widths which is one corresponds to K times of minimum width, K being integer (K>1), said portions being arranged to have spaces between second patterns which is not corresponding to J times of minimum spaces, J being integer (J>1).

As understood from the above, in the semiconductor device of this embodiment, a circuit having random patterns is formed in the on-grid region 12, and a circuit having regular patterns is formed in the off-grid region 13. In other words, the circuit having random patterns is designed to lie on grid (patterned based on grid points) to thereby reduce the number of pattern widths and pattern pitches. This saves an effort of OPC and a mask formation period. Incidentally, the semiconductor device of this embodiment is manufactured based on a manufacturing process under the condition that the minimum pattern width is 65 nm or less, for example. The manufacturing process with the minimum pattern width set to 65 nm or less requires OPC. Hence, the present invention is more effective for the formation of patterns used in such manufacturing process.

On the other hand, the circuit having regular patterns is designed to be off grid (patterned based on the wiring rule, not grid points) to thereby save a circuit layout area. It is preferred to previously check circuit operations as for the layout cells in the off-grid region 13; otherwise, the circuit cannot correctly function in the layout cell due to failures in OPC. Further, it is possible to use, for designing other semiconductor devices, a layout cell which is patterned based on the off-grid layout and the circuit operation of which is checked, if its data is registered in a library or the like.

In this embodiment, among the line patterns in the off-grid region 13, line patterns connected to the patterns of the on-grid region 12 are on grid at the outer edge of the layout cell. This enables smooth connection between the patterns of the off-grid region 13 and the patterns of the on-grid region 12. Further, the outer edge of the layout cell in the off-grid region 12 is preferably set based on the grid points. If the outer edge of the on-grid layout cell is off grid, it is possible to eliminate a useless region between the off-grid layout cell and a pattern in the on-grid region.

Incidentally, even in the case of manufacturing a semiconductor device where on-grid regions and off-grid regions coexist, automatic placement and routing can be carried out by means of CAD (Computer Aided Design) tool or the like. For example, a grid point interval and layout cells of the off-grid region are registered in the CAD tool beforehand. In this case, automatic placement and routing can be performed to arrange elements based on grid points by setting conditions for layout based on grid points, in the CAD tool. If the laid-out circuit includes a circuit corresponding to an off-grid layout cell, the layout cell may be selected from registered layout cells, and laid out in accordance with the circuit patterns.

Second Embodiment

A semiconductor device according to a second embodiment of the present invention is substantially the same as the semiconductor device of the first embodiment. In the off-grid region in the semiconductor device of the first embodiment, plural layout cells each including one functional circuit are arranged. In contrast, in the off-grid region in the semiconductor device of the second embodiment semiconductor device, plural layout cells each including plural functional circuits are arranged.

Figure 5:
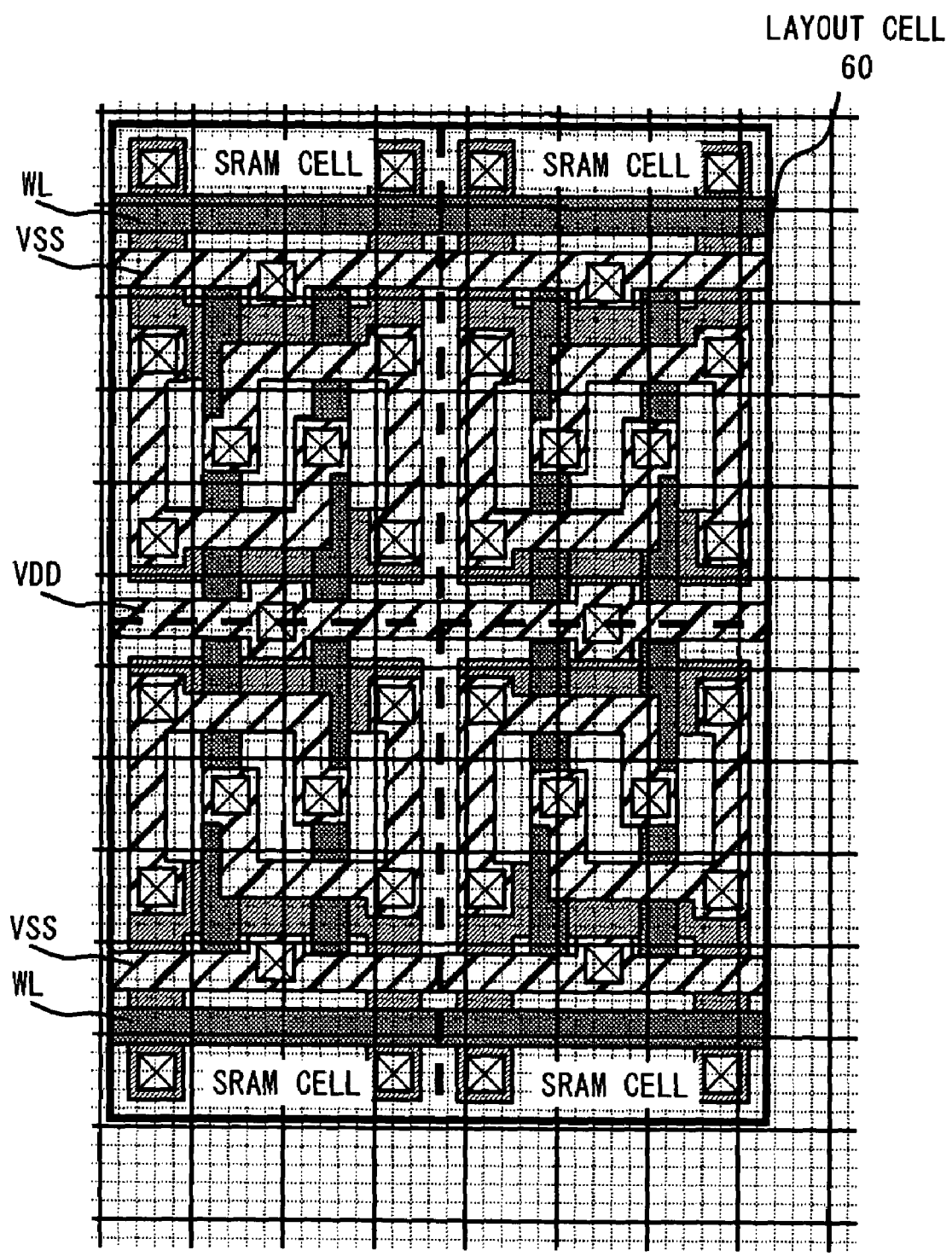
FIG. 5 shows a layout cell example formed in an off-grid region according to a second embodiment of the present invention.
Figure 6:
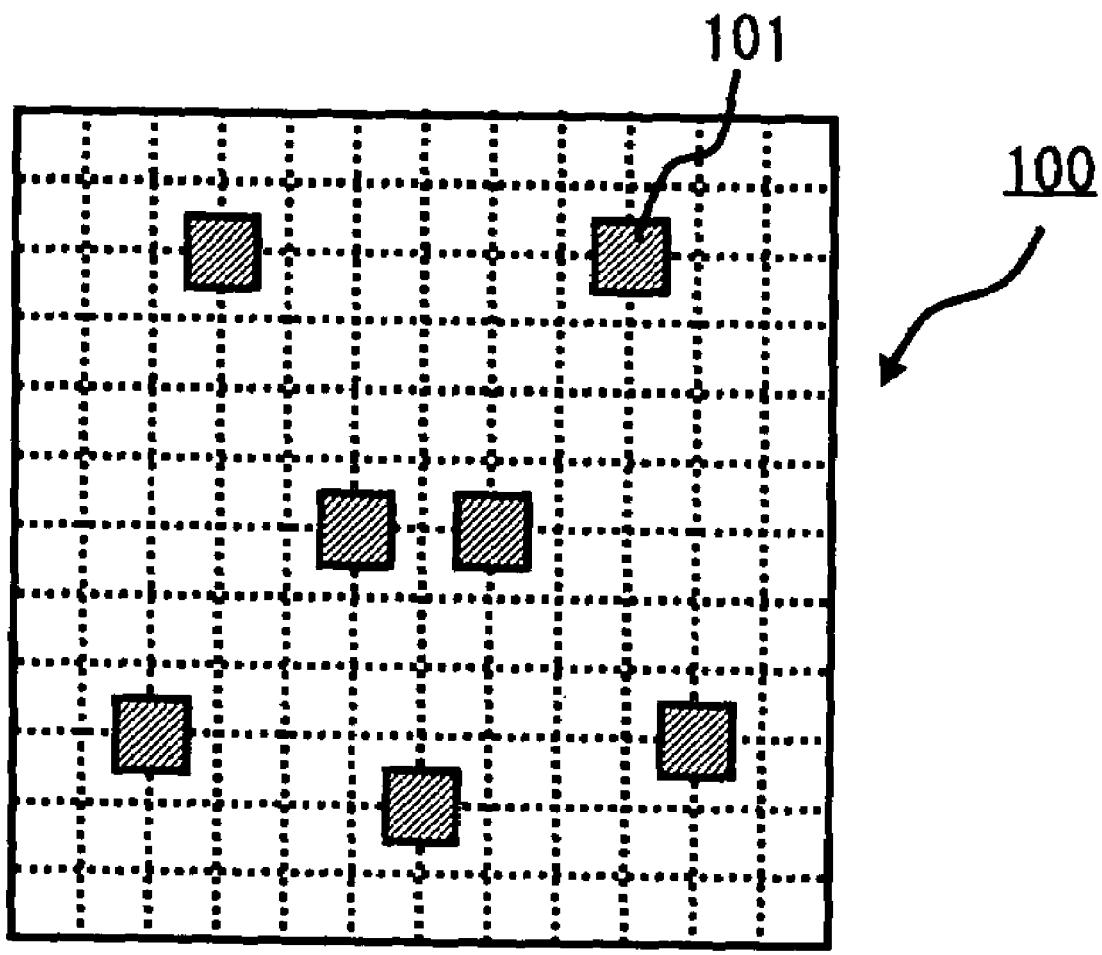
FIG. 6 shows an example of mask patterns arranged based on grid points in a semiconductor device of the related art.

FIG. 5 is a schematic layout diagram of a layout cell 60 including four SRAM cells as an example of the layout cell of the second embodiment. As shown in FIG. 5, the layout cell 60 includes two SRAM cells each in regions symmetrical with respect to the power supply line VDD. In the layout cell 60 as well, patterns connected to lines outside the layout cell are designed to lie on grid. Further, the outer edge of the layout cell 60 is on grid.

In the second embodiment, plural functional circuits are integrated into one layout cell to thereby combine patterns sharable between plural cells. Further, the layout cell allows off-grid layout, so an interval between functional circuits of the layout cell can be set in accordance with the off-grid layout. As a result, if the same number of functional circuits are laid out in the first and second embodiments, a useless region can be reduced in the layout cell of the second embodiment as compared with the layout cell of the first embodiment. In other words, if the layout cell of the second embodiment is used, a chip area can be more saved than the first embodiment.

Incidentally, the circuit registered as a layout cell is not limited to the SRAM, and a sense amplifier or the like can be registered as the layout cell.

It is apparent that the present invention is not limited to the above embodiment that may be modified and changed without departing from the scope and spirit of the invention.

What is claimed is:

1. A method of designing a semiconductor device having a circuit information region, said semiconductor device comprising:
   a first region having component patterns formed in locations based on grid points as intersections of grid lines that divide the circuit information region; and
   a second region including a plurality of layout cells an outer edge of which is defined by the grid points, the layout cells having component patterns formed based on a predetermined wiring rule with patterns connected to the component patterns of the first region among the patterns being formed based on the grid points at a boundary with the first region.

2. The method according to claim 1, wherein the layout cells each includes one or more functional circuits.

3. The method according to claim 1, wherein each of the layout cells comprises a functional circuit of the semiconductor device, and a circuit operation of the functional circuit is previously checked and registered in a library as reusable data.

4. The method according to claim 1, wherein an interval between the grid points is substantially an integral multiple or ½ of a value specified by the wiring rule.

5. The method according to claim 1, wherein a minimum pattern pitch that defines a minimum interval between component patterns or a minimum pattern width that defines a minimum width of a component pattern is preset based on the wiring rule.

6. The method according to claim 1, wherein an outer edge of a component pattern of the first region passes through a midpoint between adjacent grid points of the grid points.

7. A method having a semiconductor substrate, said semiconductor device comprising:
   a first component pattern formed on a first region and running on a first direction on the semiconductor substrate, said first component pattern being placed in accordance with a first group selected from the plurality of grid points arranged in matrix, having a width on a second direction perpendicular to the first direction, edges of the first component pattern on the second direction, being placed on a center of adjacent grid points arranged on the second direction; and
   a second component pattern formed on a second region and running on a first direction on the semiconductor substrate, said second component pattern being placed in accordance with a second group selected from the plurality of the grid points arranged in the matrix, having a width on a second direction perpendicular to the first direction, edges of the second component pattern on the second direction not being placed on a center of adjacent grid points arranged on the second direction.

8. The method according to claim 1, wherein the first region comprises a logic circuit.

9. The method according to claim 1, wherein the second region comprises a Static Random Access Memory (SRAM).

10. The method according to claim 9, wherein the SRAM comprises a bit line, a ground line, a power supply line, a cell line, and a via hole.

11. The method according to claim 10, wherein the bit line comprises an SRAM input/output line comprising a metal wiring layer,
   wherein the ground line applies a ground potential to the SRAM and comprises another metal wiring layer,
   wherein the power supply line applies a power supply potential to the SRAM and comprises said another metal wiring layer, and
   wherein the cell line connects elements in the SRAM and comprises said another metal wiring layer.

12. The method according to claim 10, wherein the bit line, the power supply line, and the ground line of the SRAM are connected to lines in the first region.

13. The method according to claim 10, wherein the bit line, the power supply line, and the ground line of the SRAM are laid out based on a part of the grid points that are arranged at an outer edge of a cell that includes the SRAM.

14. The method according to claim 1, wherein the component patterns of the layout cell in the second region are arranged based on the grid points at a boundary between the first region and the second region.

15. The method according to claim 1, wherein the wiring rule defines a minimum pattern width, a minimum pattern pitch, and an inclusive distance in said circuit information region.

16. The method according to claim 15, wherein the minimum pattern width defines a minimum pattern width in a direction orthogonal to a component pattern longitudinal direction,
   wherein the minimum pattern pitch defines a minimum interval between component patterns formed in a same layer in said semiconductor device, and
   wherein the inclusive distance defines a distance between an outer edge of a via hole and that of a metal line in a region where a via-hole region overlaps a line region.

17. The method according to claim 16, wherein a distance between component patterns formed in the same layer is set to at least the minimum pattern pitch.

18. The method according to claim 1, wherein a patterned Static Random Access Memory (SRAM) cell in the first region is larger than that of the second region.

19. The method according to claim 6, wherein a center, of said component pattern of the first region is placed on one of said grid points.

* * * * *